US009857413B2

(12) United States Patent
Farr et al.

(10) Patent No.: US 9,857,413 B2
(45) Date of Patent: Jan. 2, 2018

(54) SYSTEMS AND METHODS FOR TESTING RFID STRAPS

(71) Applicant: Avery Dennison Retail Information Services, LLC, Westborough, MA (US)

(72) Inventors: Adrian N. Farr, Essex (GB); Ian James Forster, Essex (GB)

(73) Assignee: AVERY DENNISON RETAIL INFORMATION SERVICES, LLC, Mantor, OH (US)

( * ) Notice: Subject to any disclaimer, the term of this patent is extended or adjusted under 35 U.S.C. 154(b) by 185 days.

(21) Appl. No.: 14/584,545

(22) Filed: Dec. 29, 2014

(65) Prior Publication Data
US 2016/0003898 A1 Jan. 7, 2016

Related U.S. Application Data

(60) Provisional application No. 62/019,928, filed on Jul. 2, 2014.

(51) Int. Cl.
| | |
|---|---|
| *G01R 31/02* | (2006.01) |
| *G01R 31/26* | (2014.01) |
| *G01R 27/02* | (2006.01) |
| *G06K 19/08* | (2006.01) |
| *G06K 7/00* | (2006.01) |
| *G08B 13/14* | (2006.01) |
| *G08B 21/00* | (2006.01) |
| *G01R 31/28* | (2006.01) |

(52) U.S. Cl.
CPC .............................. *G01R 31/2822* (2013.01)

(58) Field of Classification Search
CPC ........ G01R 31/02; G01R 31/26; G01R 27/02; G06K 7/00; G06K 19/08; G08B 13/14; G08B 21/00
See application file for complete search history.

(56) References Cited

U.S. PATENT DOCUMENTS

| | | | |
|---|---|---|---|
| 6,107,920 A | 8/2000 | Eberhardt et al. | |
| 6,206,292 B1 | 3/2001 | Robertz et al. | |
| 6,262,692 B1 | 7/2001 | Babb | |
| 2003/0111169 A1* | 6/2003 | Baggot | B31F 1/07 156/251 |

(Continued)

*Primary Examiner* — Son Le
*Assistant Examiner* — Neel Shah
(74) *Attorney, Agent, or Firm* — Avery Dennison Retail Information Services, LLC

(57) ABSTRACT

Systems and methods provided for testing remote frequency identification (RFID) straps on a web. Testing system includes a test head having a pair of contact pins configured to be moved toward the web (or configured to make contact with web moved towards them) and into contact with the web or RFID strap. Conveyor continuously moves the web to move individual RFID straps into and out of alignment with the test head. Controller causes the contact pins to move toward the web at a frequency that's greater than the frequency at which the conveyor moves consecutive RFID straps into alignment with the test head. Alternatively or additionally, the test head may have a mount formed of a compliant material that allows at least a portion of the test head to deflect while the contact pins are in contact with a continuously moving RFID strap, thereby maintaining contact between contact pins and strap.

10 Claims, 7 Drawing Sheets

(56) References Cited

U.S. PATENT DOCUMENTS

| | | | | |
|---|---|---|---|---|
| 2005/0001639 A1* | 1/2005 | Romanov | ............. | G01R 1/067 324/750.24 |
| 2006/0255941 A1* | 11/2006 | Carrender | .......... | G01R 31/2822 340/572.1 |
| 2007/0139057 A1* | 6/2007 | Nguyen | ................ | G01R 31/01 324/602 |
| 2007/0296554 A1* | 12/2007 | Marcus | ................... | G06K 7/00 340/10.51 |
| 2008/0001769 A1* | 1/2008 | Mayer-Zintel | ....... | G01R 31/312 340/653 |
| 2008/0100329 A1* | 5/2008 | Nguyen | ............. | G01R 31/2822 324/756.01 |

* cited by examiner

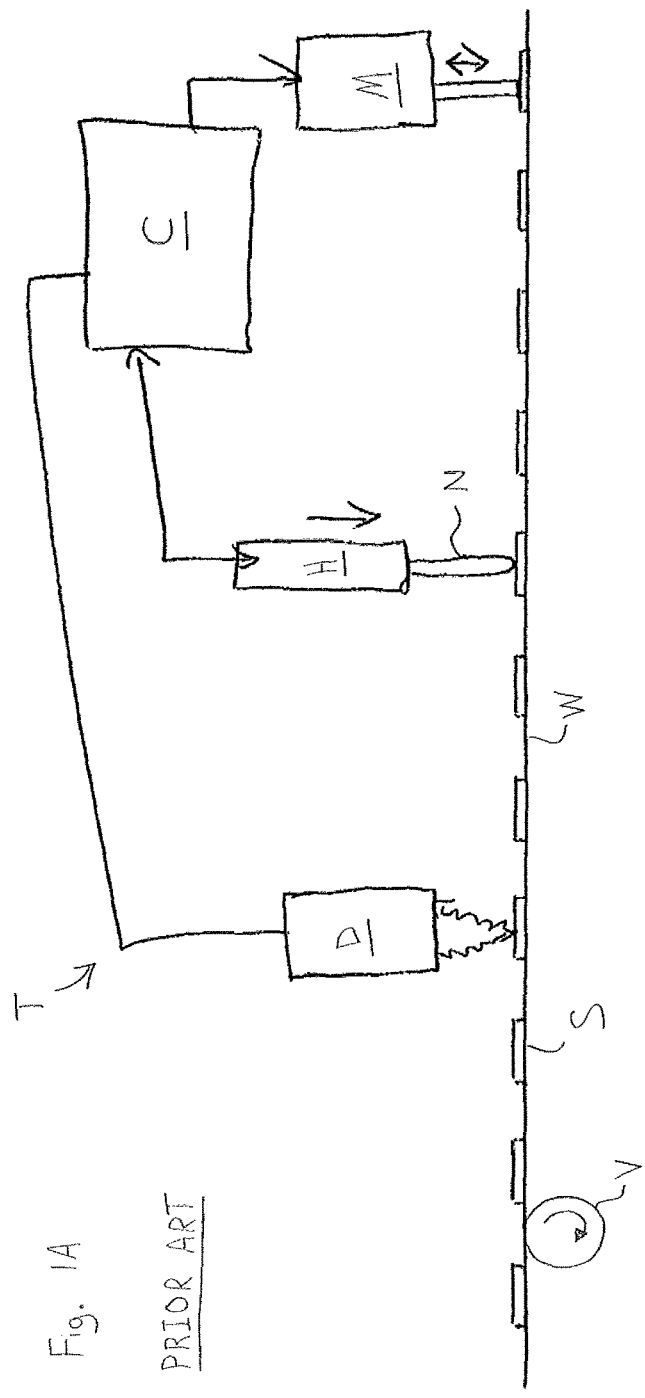
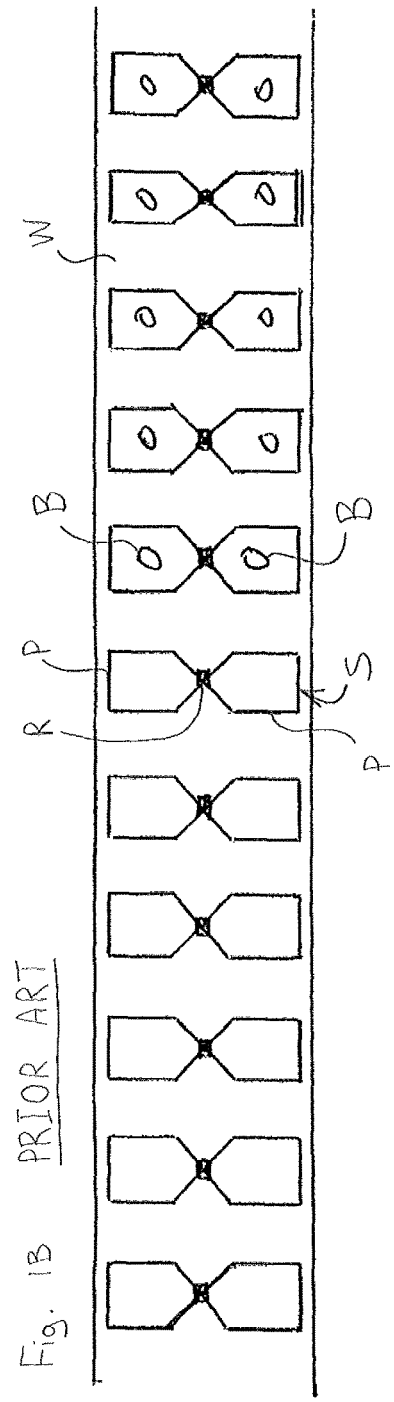
Fig. 1A PRIOR ART
Fig. 1B PRIOR ART

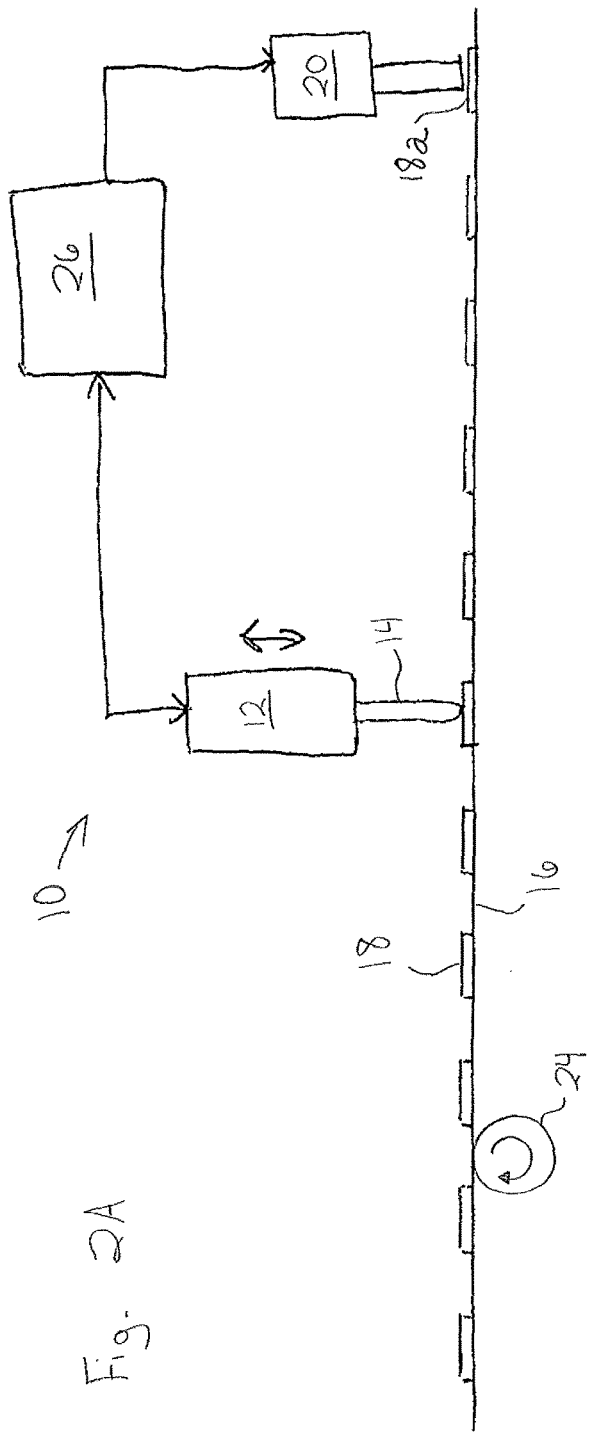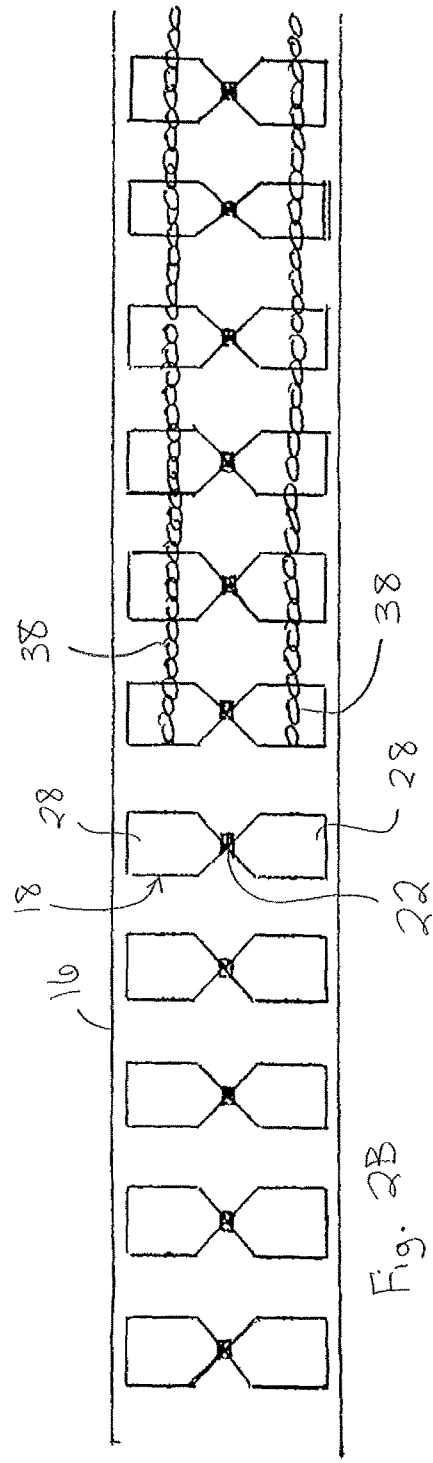

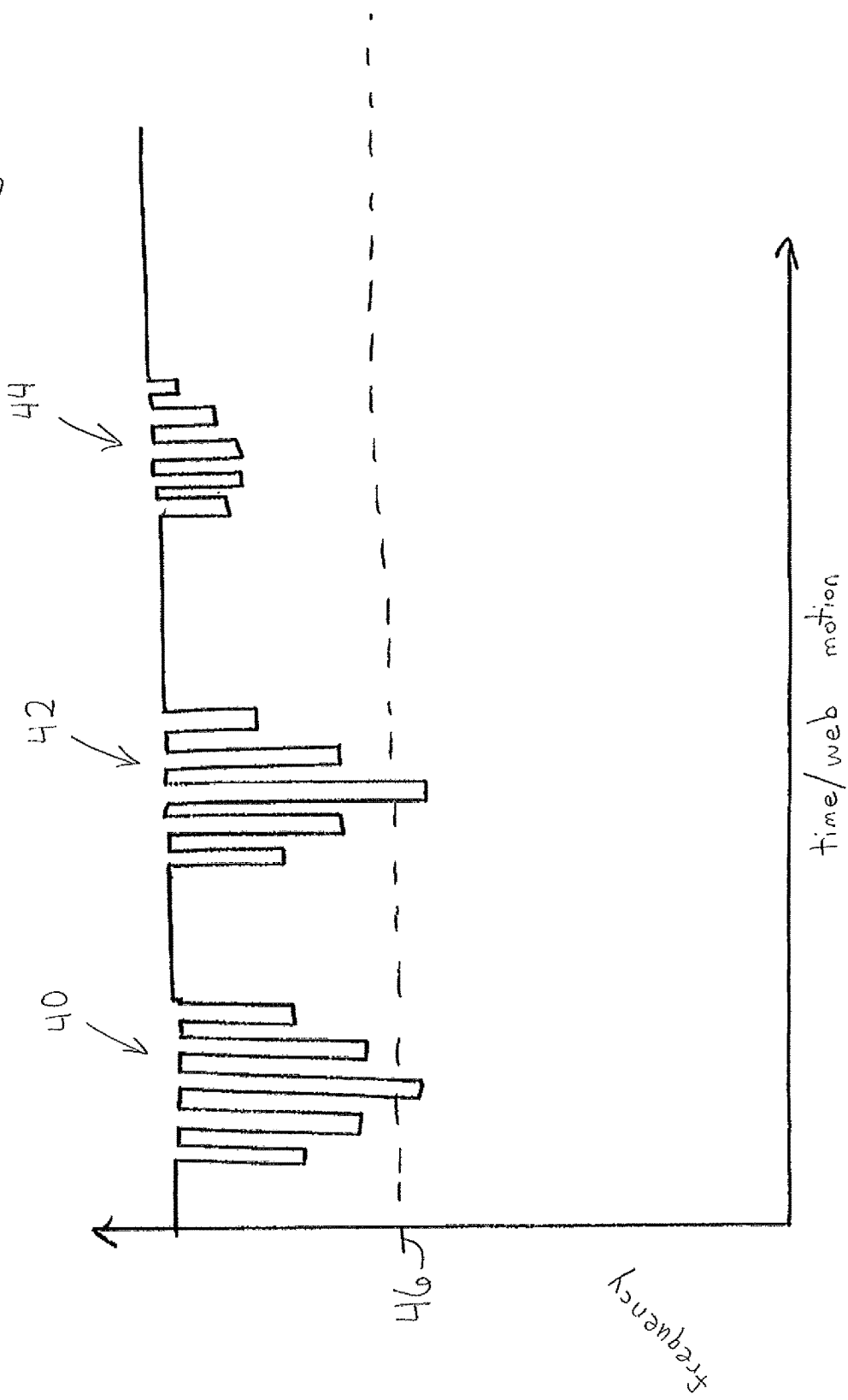

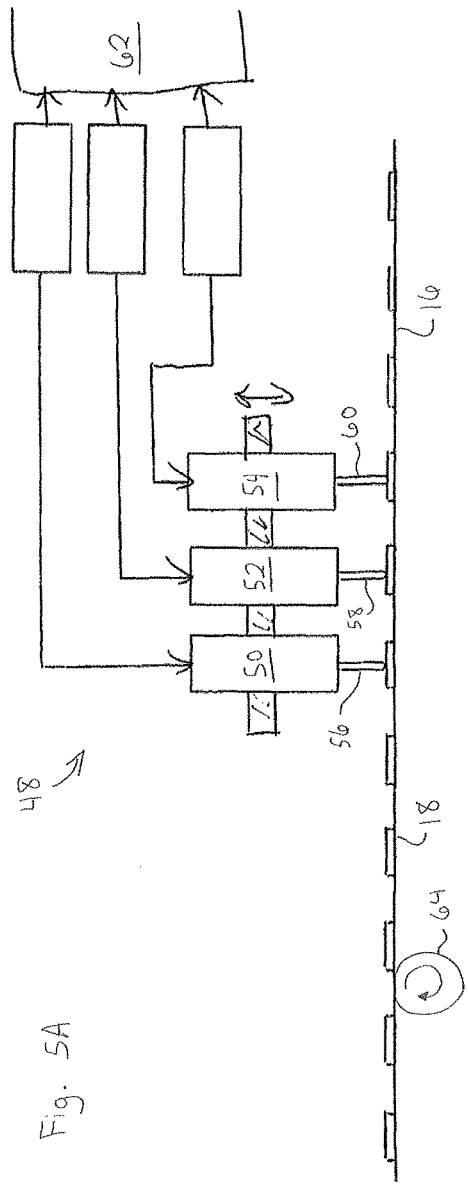
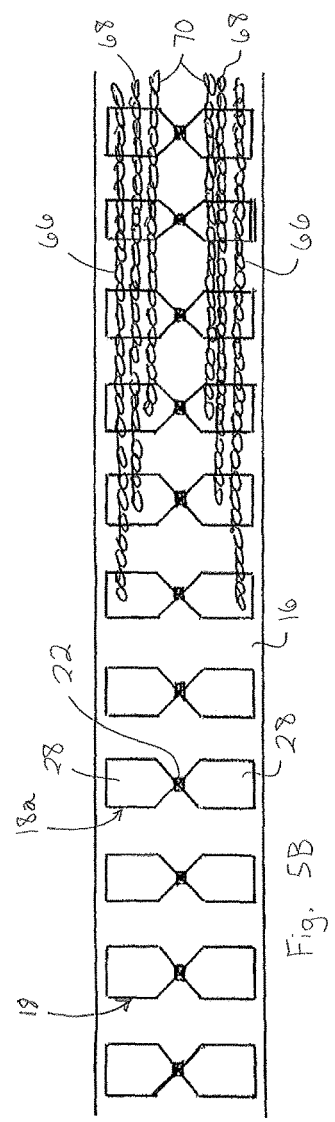

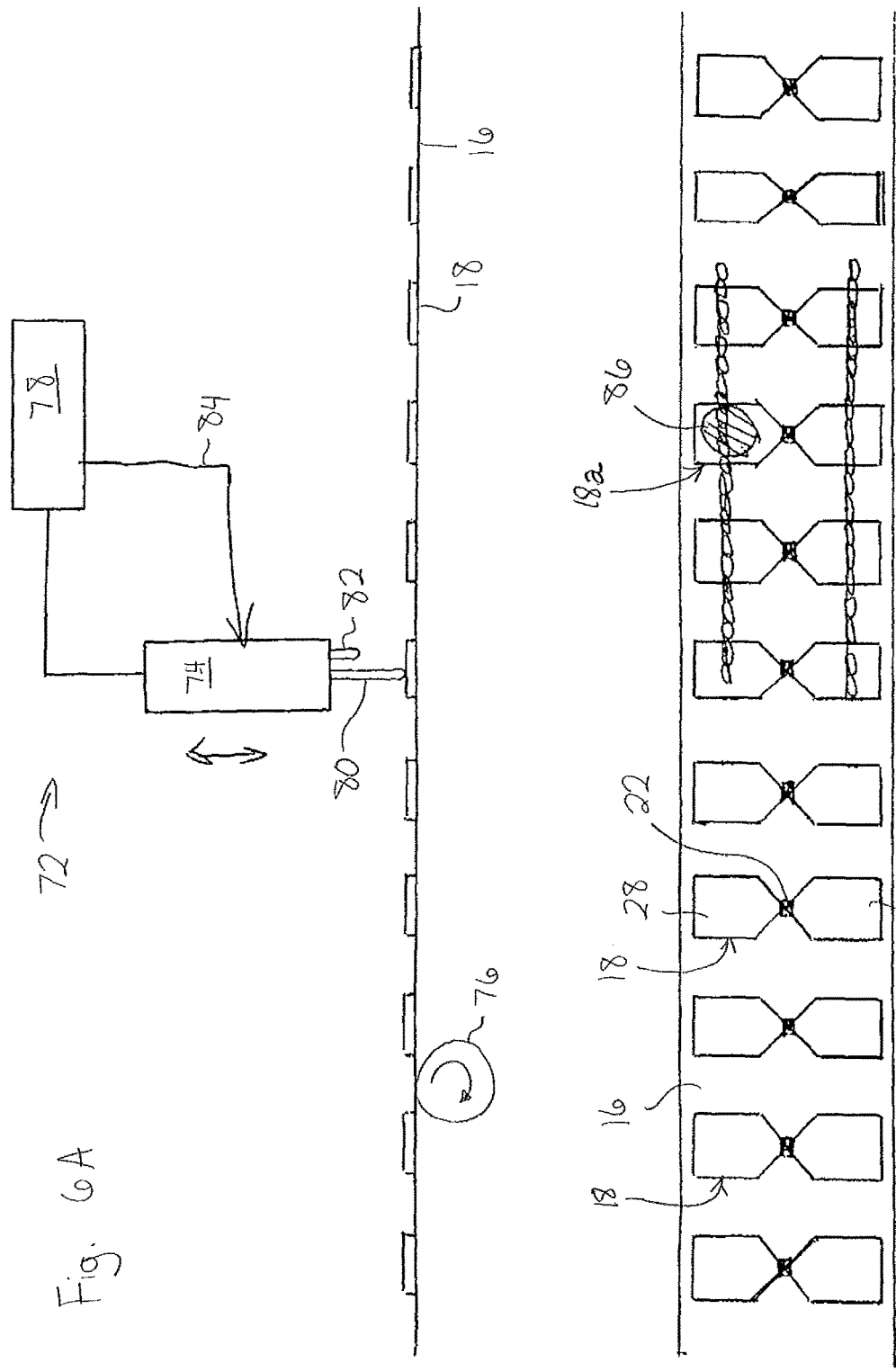

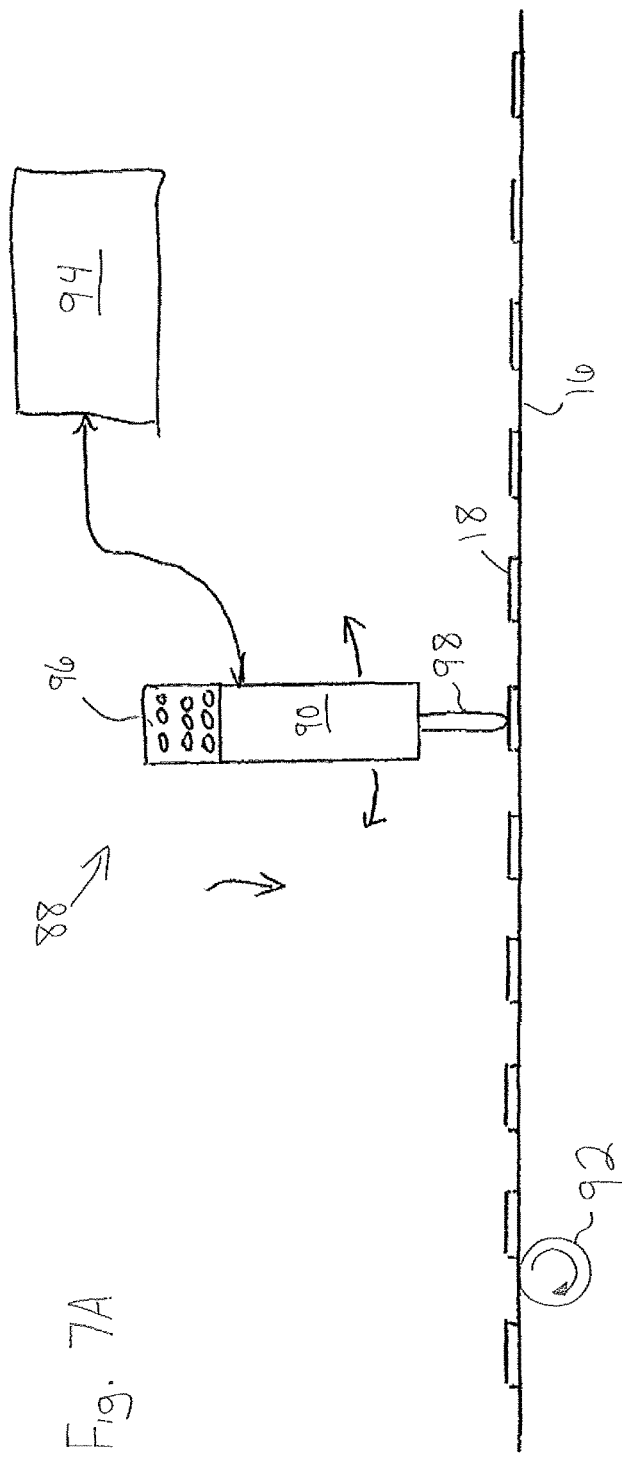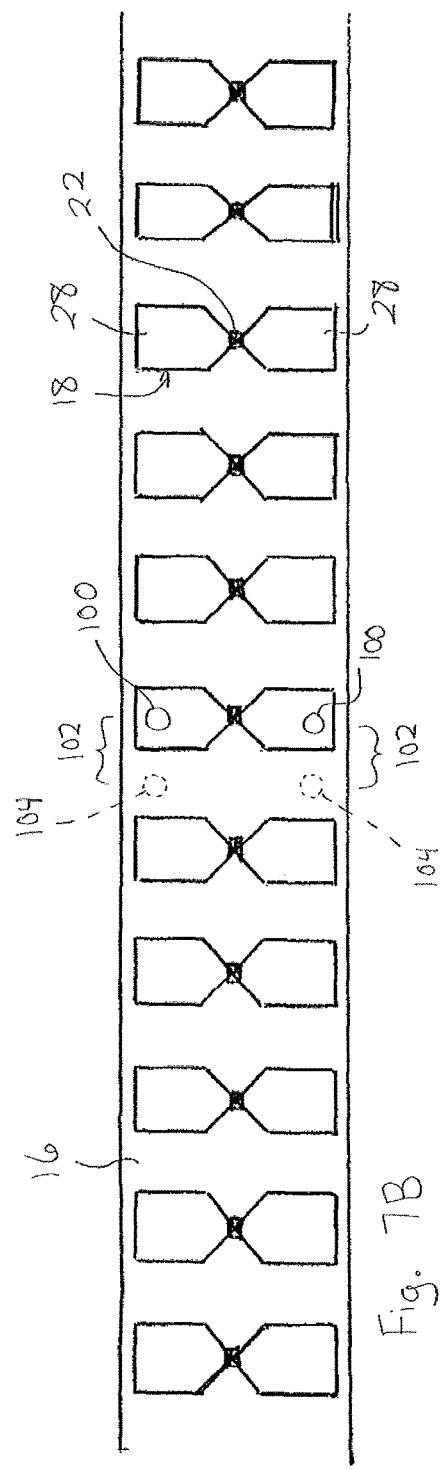

SYSTEMS AND METHODS FOR TESTING RFID STRAPS

CROSS-REFERENCE TO RELATED APPLICATION(S)

The present application claims priority from U.S. Provisional Application No. 62/019,928 filed Jul. 2, 2014, which is incorporated herein by reference in its entirety.

BACKGROUND

Field of the Disclosure

The present subject matter relates to radio frequency identification ("RFID") devices. More particularly, the present subject matter relates to systems and methods for testing continuously moving RFID straps.

Description of Related Art

RFID tags and labels (collectively referred to herein as "devices") are widely used to associate an object with an identification code. RFID devices generally have a combination of antennae and analog and/or digital electronics, which may include, for example, communications electronics, data memory, and control logic. For example, RFID tags are used in conjunction with security locks in cars, for access control to buildings, and for tracking inventory and parcels. Some examples of RFID tags and labels appear in U.S. Pat. Nos. 6,107,920; 6,206,292; and 6,262,692, all of which are hereby incorporated herein by reference in their entireties.

One difficulty associated with RFID devices is the need to test operation of such devices as part of the manufacturing or fabrication process. In fabrication of RFID devices, the devices may be formed on a sheet or roll or web of material, closely spaced apart. In traditional methods of activating, reading, and/or detecting RFID devices, an antenna is used to send radio frequency ("RF") fields over a relatively long range, that is over intervening free space. When such methods are applied to testing closely spaced RFID devices, it is difficult to test a single RFID device, since the RF field interacts with several devices simultaneously, and the various RFID devices may interact with one another.

According to another known approach for testing RFID devices, which is illustrated in FIGS. 1A and 1B, RFID straps S (each of which includes an RFID chip R in contact with and spanning the space between a pair of enlarged contact or terminal pads P) on a web W are tested by contact. In particular, a test system T includes a central controller C which controls the function of the other components of the test system T, which may include a strap detector D, a test head H, a strap marker or chip crusher M, and a conveyor mechanism V for moving the web W with respect to these other components. When an RFID strap S moves (in a left-to-right direction in the orientation of FIGS. 1A and 1B) into place beneath the test head H, a pair of contact pins or probes N of the test head H move downwardly to contact the two contact pads P of the RFID strap S at contact points B (FIG. 1B). The contact pins H measure one or more parameters of the RFID strap S, such as the assembled chip resistance, assembled chip capacitance or RFID read/write functionality, with an RFID strap S being marked as defective or destroyed by the strap marker or chip crusher M if it does not meet preselected performance standards. In this context 'assembled' includes additional resistance and/or capacitive components in addition to the chip resistance/capacitance, frequently described as parasitic. The RFID strap S must be stationary when it is being tested, which requires the test system T to include a trigger mechanism that instructs the conveyor V to stop the web W when an RFID strap S is in place.

If multiple RFID straps S are to be tested simultaneously, then during each test cycle, the web W must be moved so as to advance that number of RFID straps S into alignment with the matching number of test heads H. The movement of the web W is then stopped, the contact pins N of the test heads H are brought into engagement with the RFID straps S, and then the process is repeated for the next set of RFID straps S. This further increases the complexity required of the test system T, because a plurality of RFID straps S must be simultaneously aligned with a plurality of test heads H, the multiple test heads H must be precisely moved simultaneously, and the results of multiple test heads H must be precisely matched, all of which requires precise alignment or individual compensation values in the software of the controller C.

SUMMARY

There are several aspects of the present subject matter which may be embodied separately or together in the devices and systems described and claimed below. These aspects may be employed alone or in combination with other aspects of the subject matter described herein, and the description of these aspects together is not intended to preclude the use of these aspects separately or the claiming of such aspects separately or in different combinations as may be set forth in the claims appended hereto.

In one aspect of the disclosure, a system for testing RFID straps on a web includes a test head, a conveyor, and a controller. The test head includes a pair of contact pins configured to be moved toward the web and into contact with the web or an RFID strap on the web. Alternatively the web can be pushed up or down against the contact pins in a perpendicular direction to its usual sideways motion though an assembly machine (note that moving the web into contact with the pins is an alternative to moving the pins to the web which may apply to other cases). The conveyor is configured to continuously move the web so as to move individual RFID straps into and out of alignment with the test head. The controller is programmed to control movement of the contact pins and the conveyor, with the controller causing the contact pins to be moved toward the web at a frequency that is greater than the frequency at which the conveyor moves consecutive RFID straps into alignment with the test head.

In another aspect, a method is provided for testing RFID straps on a continuously moving web. A pair of contact pins is periodically moved toward the web and into contact with the web or an RFID strap on the web. The contact pins are moved toward the web at a frequency that is greater than the frequency at which consecutive RFID straps are moved into alignment with the contact pins.

There may be scenarios where the strap structure has more than 2 pads, for example where the chip has more than one RF input for connection to an antenna, or where it has an additional port, such as an 'anti-tamper' port.

The term 'contact' should include capacitive coupling, where the capacitance varies with the vertical motion, and, for a strap in the form of a loop or ring, designed to magnetically couple to an antenna, the 'contact' could be magnetic, where the vertical motion varies the magnetic coupling as well as the degree that the test coil and loop are co-axial to each other.

This test method could be used for completed antennas with an RFID chip, where the test system would evaluate both the strap or chip, its connection to the antenna and the antenna as a composite value.

In yet another aspect, a system for testing an RFID strap includes a test head, a conveyor, and a controller. The test head includes a pair of contact pins configured to be moved into contact with an RFID strap. The conveyor is configured to continuously move the RFID strap into and out of alignment with the test head. The controller is programmed to control movement of the contact pins and the conveyor, with the test head including a mount formed of a compliant material that allows at least a portion of the test head to deflect while the contact pins are in contact with the continuously moving RFID strap, thereby maintaining stable contact between the contact pins and the continuously moving RFID strap.

In another aspect, a method is provided for testing an RFID strap that is continuously moved into and out of alignment with a test head. A pair of contact pins of the test head is moved in a direction substantially perpendicular to the direction of movement of the continuously moving RFID strap so as to contact the continuously moving RFID strap. While the contact pins are in contact with the continuously moving RFID strap, at least a portion of the test head is allowed to deflect, thereby maintaining stable contact between the contact pins and the continuously moving RFID strap.

BRIEF DESCRIPTION OF THE DRAWINGS

FIG. 1A is a diagrammatic side view of a system for testing RFID straps, according to conventional design;

FIG. 1B is a diagrammatic top view of a web of RFID straps being tested by the system of FIG. 1A;

FIG. 2A is a diagrammatic side view of a system for testing RFID straps, according to an aspect of the present disclosure;

FIG. 2B is a diagrammatic top view of a web of RFID straps being tested by the system of FIG. 2A;

FIG. 4 is a chart illustrating test results of a plurality of RFID straps being tested by the system of FIG. 2A;

FIG. 5A is a diagrammatic side view of another embodiment of a system for testing RFID straps, according to an aspect of the present disclosure;

FIG. 5B is a diagrammatic top view of a web of RFID straps being tested by the system of FIG. 5A;

FIG. 6A is a diagrammatic side view of yet another embodiment of a system for testing RFID straps, according to an aspect of the present disclosure;

FIG. 6B is a diagrammatic top view of a web of RFID straps being tested by the system of FIG. 6A;

FIG. 7A is a diagrammatic side view of another embodiment of a system for testing RFID straps, according to an aspect of the present disclosure; and FIG. 7B is a diagrammatic top view of a web of RFID straps being tested by the system of FIG. 7A.

DESCRIPTION OF THE ILLUSTRATED EMBODIMENTS

Figure 3:
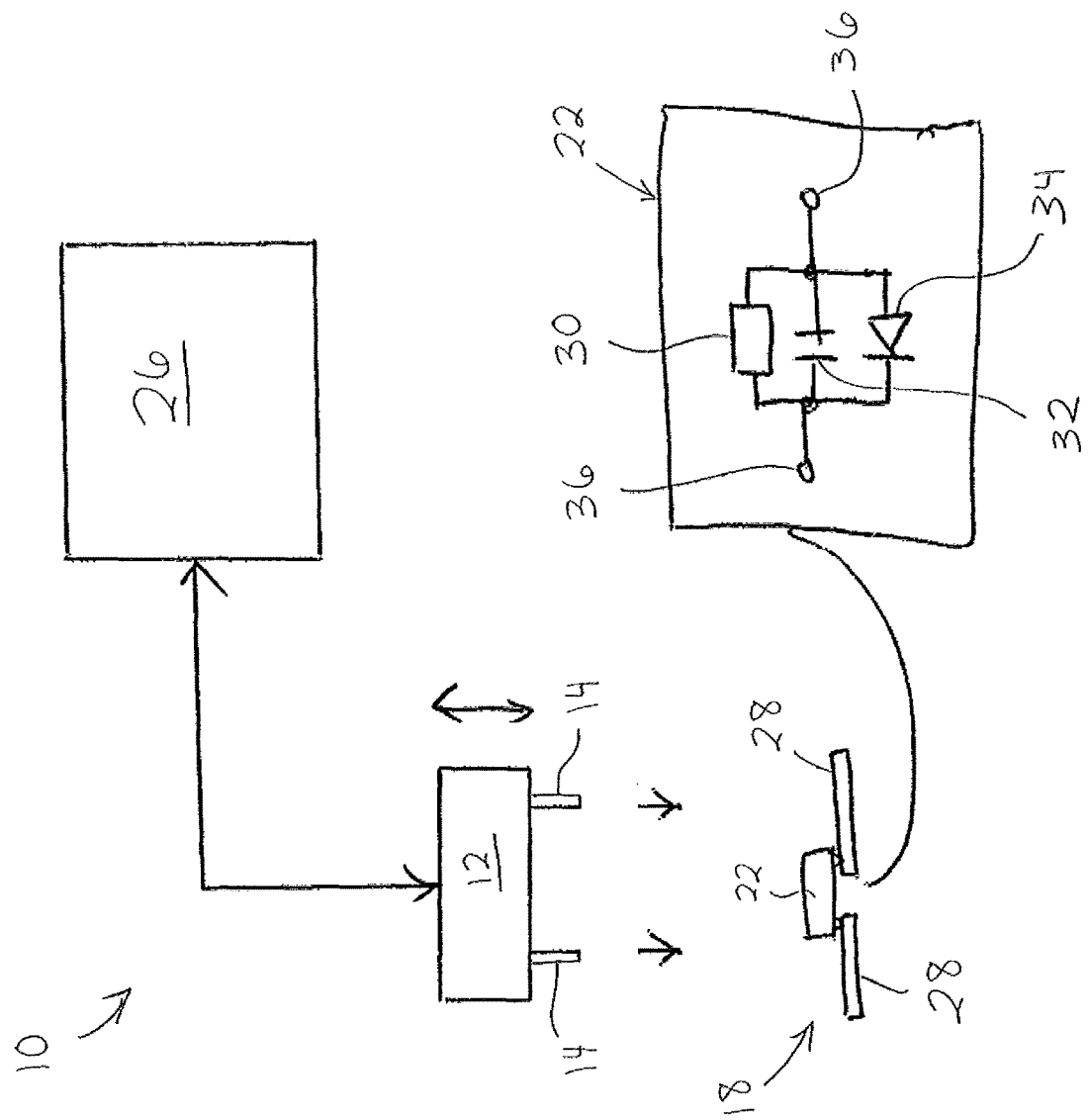
FIG. 3 is a diagrammatic end view of the system of FIG. 2A, with a diagrammatic detail view of an RFID chip of an RFID strap.

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

FIG. 2A illustrates a test system 10 according to the present disclosure. The test system 10 includes at least one test head 12 with a pair of contact pins or probes 14 (FIG. 3). The contact pins 14 are configured to be moved toward and away from a web 16 on which a plurality of RFID straps 18 are mounted. In the orientation of FIG. 2A, the contact pins 14 are positioned above the web 16, such that the contact pins 14 are moved in a downward direction to approach the web 16 and in an upward direction to move away from the web 16. The web 16 moves in a direction substantially perpendicular to the movement of the contact pins 14 (in a left-to-right direction in the orientation of FIG. 2A) to move the RFID straps 18 into and then out of alignment with the test head 12. The contact pins 14 are brought into contact with portions of individual RFID straps 18 to test a performance standard of the RFID strap 18, as will be described in greater detail herein. While systems in which the contact pins 14 are moved to come into contact with an RFID strap 18 on a web 16 are described and illustrated herein, it is also within the scope of the present disclosure for the contact pins 14 to be substantially stationary, with the web 16 being periodically moved toward the contact pins 14 (in addition to its movement to advance the RFID straps 18 through the test system 10) at a high frequency (e.g., by action of an electromagnet).

The test system 10 may further include a strap marker or chip crusher 20 positioned downstream of the test head 12 (i.e., positioned such that an RFID strap 18 on the web 16 will move into alignment with the test head 12 before moving into alignment with the strap marker or chip crusher 20). The strap marker or chip crusher 20 is used to designate a defective RFID strap 18a that has failed to meet the performance standard tested by the contact pins 14. If a strap marker is provided, then it will be moved into contact with the defective RFID strap 18a and then place a mark or symbol on the RFID strap 18a that designates the RFID strap 18a as defective or faulty or inoperative. If a chip crusher is provided, then it will be moved into contact with the RFID strap 18a to crush or destroy or otherwise disable the RFID chip of that defective RFID strap 18a.

The test system 10 may also include a conveyor 24 which continuously moves the web 16 to bring the RFID straps 18 into and out of alignment with the test head 12 and the strap marker or chip crusher 20 for defective RFID straps 18a. The conveyor 24 may be variously configured without departing from the scope of the present disclosure. For example, in one embodiment, the web 16 is provided on a spool or reel, with the conveyor 24 being configured to unspool the web 16 and advance it through the test system 10 and then wind the web 16 onto another spool or reel. In contrast to the test system T of FIG. 1A, the conveyor 24 continuously moves the RFID straps 18 through test system 10, without periodically stopping the movement of the web 16 for testing the RFID straps 18.

The performance of the test head 12, the strap marker or chip crusher 20, and the conveyor 24 (as well as any other components of the test system 10) may be controlled by a central controller 26. The controller 26 may be variously configured, such as being provided in the form of a microprocessor, without departing from the scope of the present disclosure.

The individual RFID straps 18 are spaced along the length of the web 16, with each RFID strap 18 including an RFID chip 22 in contact with and spanning the space between a pair of enlarged contact or terminal pads 28. FIG. 3 illustrates a simplified structure of an exemplary RFID chip 22. The RFID chip 22 of FIG. 3 includes a resistor 30, a capacitor 32, and a diode 34 connected in parallel between two connection points 36 at which the RFID chip 22 is physically and electrically coupled to the contact pads 28. Accordingly, a signal sent from one contact pad 28 to the other contact pad 28 (e.g., by the contact pins 14 upon contacting the two contact pads 28) will pass through the resistor 30, the capacitor 32, and the diode 34, such that different electrical properties of the RFID strap 18 (namely, its capacitance, resistance, and ability to convert alternate current to direct current) may be measured.

In the embodiment of FIGS. 2A, 2B and 3, up and down motion of the test head of this embodiment is asynchronous to the web motion. The controller 26 causes the contact pins 14 to be periodically moved toward and away from the web 16, with the contact pins 14 being moved toward the web 16 at a frequency that is greater than the frequency at which the conveyor 24 moves consecutive RFID straps 18 into alignment with the test head 12. For example, the conveyor 24 may bring a new RFID strap 18 into alignment with the test head 12 once every second, while the contact pins 14 are brought downwardly toward the web 16 several times per second. By moving the contact pins 14 toward the web 16 at a relatively high frequency, the contact pins 14 will be moved into contact (at contact points 38) with each RFID strap 18 several times, as well as being moved into contact with the web 16 several times between adjacent RFID straps 18, as shown in FIG. 2B. If the speed of the web 16 is changed during use, then it results in more or fewer contact points 38 between the contact pins 14 and the RFID straps 18, rather than rendering the test system 10 incapable of testing the RFID straps 18. Accordingly, as the test head 12 moves asynchronously to the web 16, a strap sensor may be omitted from the test system 10, although it is also within the scope of the present disclosure for the test system 10 to include a strap sensor.

On account of the contact pins 14 contacting each RFID strap 18 several times and the time needed for the contact pins 14 to be in contact with an RFID strap 18 to test the RFID strap 18 being relatively short, each RFID strap 18 may be tested several times during a single pass through the test system 10 and without stopping or changing the speed of the web 16. For example, FIG. 4 illustrates one manner of testing the capacitance of an RFID strap 18. After a signal is sent through an RFID strap 18 by the contact pads 14, the controller 26 converts the capacitance of the RFID strap 18 to a frequency. FIG. 4 shows three clusters of readings 40, 42, and 44 for three consecutive RFID straps 18 being tested, with the capacitance of each RFID strap being tested five times in a single pass through the test system 10. The large gaps between adjacent clusters of readings in FIG. 4 represent the times at which the contact pins 14 are positioned between adjacent RFID straps 18, with downward movement of the contact pins 14 bringing them into contact with the web 16. Rather than using an absolute frequency for the test, a differential between an open circuit state (when the contact pins 14 contact the web 16) and the contact state (when the contact pins 14 contact an RFID strap 18) may be used, which may compensate for any drift or difference between measuring systems.

As shown in FIG. 4, the various tests performed on each RFID strap 18 may yield different readings, which may vary depending on where the contact pins 14 contact the RFID strap 18 (e.g., a maximum reading may be registered at the center of the strap 18). A preselected threshold value 46 is used by the controller 26 to determine whether an RFID strap 18 has been properly assembled and is functioning properly. In the illustrated embodiment, one reading in each of the first two clusters 40 and 42 exceeds the threshold frequency 46, which indicates to the controller 26 that the associated RFID strap 18 has been properly assembled and is functioning properly. The third reading cluster 44 fails to include a single reading that exceeds the threshold frequency 46, which indicates to the controller 26 that the associated RFID strap 18 is defective. When the controller 26 has determined that an RFID strap is a defective strap 18a, it may order the strap marker or chip crusher 20 to move toward the web 16 when the defective strap 18a is aligned therewith to either mark the strap 18a as defective or to destroy the RFID chip 22.

While FIG. 4 illustrates one manner of testing an RFID strap 18, other testing protocols may be employed without departing from the scope of the present disclosure. For example, rather than looking for a single reading that exceeds a threshold value, the controller 26 may be programmed to calculate the average of the multiple readings taken on the RFID strap 18, with a weighted or unweighted average being compared to a threshold value. Additionally, a value other than the capacitance of the RFID strap 18 may be monitored to determine whether the RFID strap 18 has passed or failed the test. For example, the resistance of the RFID strap 18 (which is a composite of the resistance of the RFID chip 22 and its connections to the contact pads 28) or the ability of the RFID strap 18 to convert alternating current to direct current may be monitored and compared to a threshold value to assess whether the RFID strap 18 has passed or failed the test.

In another embodiment, a test system 48 (FIGS. 5A and 5B) is provided with a plurality of test heads, which may be employed to test the same or different electrical characteristics of an RFID strap 18 or for other purposes. In the test system 48 shown in FIG. 5A, more than one test head is provided, with each test head performing the same or a different function, such as testing different electrical characteristics of the RFID straps 18. FIG. 5A shows three test heads 50, 52, and 54, each of which includes a pair of contact pins 56, 58, and 60. In the illustrated embodiment, the spacing between the two contact pins of each pair is different. For example, FIG. 5B shows that the spacing between the contact pins 56 of the first test head 50 is greater than the spacing between the contact pins 58 of the second test head 52, which is greater than the spacing between the contact pins 60 of the third test head 54. In other embodiments, the spacing between the two contact pins of each pair may be the same for each test head. Further, while FIGS. 5A and 5B illustrate a test system 48 incorporating three test heads 50, 52, and 54, it is also within the scope of the present disclosure for a test system to include two test heads or more than three test heads.

The individual test heads 50, 52, and 54 and their associated contact pins 56, 58, and 60 may be configured to function according to the foregoing description of the test head 12 and contact pins 14 of FIGS. 2A, 2B and 3. Thus, a controller 62 of the test system 48 may cause the contact pins 56, 58, and 60 to be periodically moved toward the web 16 at a frequency that is greater than the frequency at which a conveyor 64 of the test system 48 continuously moves consecutive RFID straps 18 into alignment with the respective test heads 50, 52, and 54. For example, the conveyor 64 may bring an RFID strap 18 into alignment with each test head 50, 52, and 54 once every second, while the contact pins 56, 58, and 60 are brought downwardly toward the web 16 several times per second (or with the contact pins 56, 58, and 60 being stationary and the web 16 being moved upwardly into contact with the contact pins 56, 58, and 60). By moving the contact pins 56, 58, and 60 toward the web 16 at a relatively high frequency, the contact pins 56, 58, and 60 will be moved into contact (at contact points 66, 68, and 70, respectively) with each RFID strap 18 several times, as well as being moved into contact with the web 16 several times between adjacent RFID straps 18, as shown in FIG. 5B. The pairs of contact pins 56, 58, and 60 may be configured to move at the same or different frequencies, with the movement of two or more pairs of contact pins being either synchronized or asynchronous if the contact pins move at the same frequency.

In one embodiment, one test head 50 may measure a first electrical property of the RFID straps 18 (e.g., capacitance), a second test head 52 may measure a second electrical property of the RFID straps 18 (e.g., resistance), while the third test head 54 may measure a third electrical property of the RFID straps 18 (e.g., ability to convert alternate current into direct current). The controller 62 may compare the three electrical properties to three respective threshold values and, if the reading of an RFID strap 18 (whether it is an individual reading or an average of the readings) fails to meet or exceed one or more of the threshold values, then the controller 62 may order a strap marker or chip crusher to move toward the web 16 when the defective strap 18a is aligned therewith to either mark the strap 18a as defective or to destroy the RFID chip 22. In another embodiment, one of the test heads may be configured to determine the threshold power at which an RFID strap 18 begins communicating with a reader system. In yet another embodiment, one of the test heads may be configured to input data into the RFID strap 18, such as an identification code or a password or the like. If such an "input" test head is provided, it may be advantageous for it to be positioned downstream of a test head that determines whether the RFID strap 18 is assembled and functioning properly.

FIGS. 6A and 6B illustrate an aspect that may be incorporated into a test system according to the present disclosure. In the embodiment of FIGS. 6A and 6B, the test system 72 includes a test head 74, conveyor 76, and controller 78 of the type described above with respect to the embodiment of FIGS. 2A, 2B and 3. In addition to a pair of contact pins 80, the test head 74 further includes a strap marker or chip crusher 82 mounted thereon. The strap marker or chip crusher 82 may be configured to function similarly to the strap marker or chip crusher 20 of FIGS. 2A-3, receiving a signal 84 from the controller 78 to either mark a strap 18a as defective (as in FIG. 6B, where an RFID strap 18a has received a mark 86 that identifies it as being defective) or destroy a defective RFID chip 22. The test performed by the contact pins 80 may be carried out sufficiently quickly that a determination as to whether an RFID strap 18 passes or fails the test may be made during the brief time that the test head 47 is aligned with the RFID strap 18. By diagnosing and then immediately marking or destroying a defective RFID strap 18a, a shift register which catalogs a defective RFID strap 18a for later marking or destruction may be omitted.

FIGS. 7A and 7B illustrate another arrangement that may be practiced separately or in combination with any of the other features described herein. In the embodiment of FIG. 7A, a test system 88 includes a test head 90, a conveyor 92, and a controller 94 that may be provided according to the foregoing description of the embodiment of FIGS. 2A, 2B and 3. The test system 88 may include additional components (e.g., a strap detector and a strap marker or chip crusher) without departing from the scope of the present disclosure.

The test head 88 includes a mount 96 formed of a compliant material, such as an elastomeric material (e.g., a rubber material). The compliant mount 96 allows the portion of the test head 90 between the mount 96 and the web 16 to deflect away from its typical orientation (substantially vertical in FIG. 7A). In particular, the contact pins 98 of the test head 90 are deployed in a direction substantially perpendicular to the motion of the web 16 and the RFID straps 18 on the web 16. When the contact pins 98 are in contact with an RFID strap 18, the mount 96 allows the test head 90 to deflect (with the mount 96 acting as a pivot point), such that the contact pins 98 maintain stable contact with the RFID strap 18 as the strap 18 moves out of alignment with the test head 90, rather than dragging along the RFID strap 18. This may allow the web 16 to be moved at a relatively high rate, as the mount 96 causes the contact pins 98 to remain in contact with an RFID strap 18 for a longer time than the RFID strap 18 is actually aligned with the test head 90. For example, FIG. 7B illustrates a contact point 100 at which the contact pins 98 remain in stable contact with an RFID strap 18 at a location displaced a distance 102 from the point 104 at which the RFID strap 18 was in alignment with the test head 90. At a certain distance 102 (which may depend on a number of factors, including the material composition and configuration of the mount 96), the test head 90 pivots or deflects back into its initial orientation (substantially vertical in the illustrated embodiment) for contact with the next RFID strap 18.

It will be understood that the embodiments described above are illustrative of some of the applications of the principles of the present subject matter. Numerous modifications may be made by those skilled in the art without departing from the spirit and scope of the claimed subject matter, including those combinations of features that are individually disclosed or claimed herein. For these reasons, the scope hereof is not limited to the above description but is as set forth in the following claims, and it is understood that claims may be directed to the features hereof, including as combinations of features that are individually disclosed or claimed herein.

The invention claimed is:

1. A system for testing RFID straps on a web, comprising:
   a test head including a pair of contact pins configured to be moved toward the web and into contact with the web or an RFID strap on the web;
   a conveyor configured to continuously move the web so as to move individual RFID straps into and out of alignment with the test head; and
   a controller programmed to control movement of the contact pins and the conveyor, with the controller causing the contact pins to be moved toward the web at a frequency that is greater than the frequency at which the conveyor moves consecutive RFID straps into alignment with the test head.

2. The system of claim 1, further comprising a second test head including a pair of contact pins configured to be moved toward the web and into contact with the web or an RFID strap on the web.

3. The system of claim 2, wherein the test heads are configured to test different electrical properties of the RFID straps.

4. The system of claim 2, wherein the controller is programmed to synchronize movement of the contact pins of the test heads.

5. The system of claim 1, wherein the controller is programmed to control movement of the contact pins so as to move the contact pins into contact with each RFID strap multiple times.

6. A method of testing RFID straps on a web, comprising:
continuously moving a web including a plurality of RFID straps; and
periodically moving a pair of contact pins toward the web and into contact with the web or an individual RFID strap on the web, wherein the contact pins are moved toward the web at a frequency that is greater than the frequency at which consecutive RFID straps on the web are moved into alignment with the contact pins.

7. The method of claim 6, wherein said periodically moving a pair of contact pins includes periodically moving a second pair of contact pins toward the web and into contact with the web or an RFID strap on the web.

8. The method of claim 7, wherein the pairs of contact pins are configured to test different electrical properties of the RFID straps.

9. The method of claim 7, wherein the periodic movement of the pairs of contact pins is synchronized.

10. The method of claim 6, wherein said periodically moving a pair of contact pins includes moving the contact pins into contact with each RFID strap multiple times.

* * * * *